(12) United States Patent
Cok et al.

(10) Patent No.: US 8,259,095 B2
(45) Date of Patent: Sep. 4, 2012

(54) OPTICALLY TESTING CHIPLETS IN DISPLAY DEVICE

(75) Inventors: Ronald S. Cok, Rochester, NY (US); John W. Hamer, Rochester, NY (US); Michael W. Mattern, Hamlin, NY (US)

(73) Assignee: Global OLED Technology LLC, Herndon, VA (US)

( * ) Notice: Subject to any disclaimer, the term of this patent is extended or adjusted under 35 U.S.C. 154(b) by 580 days.

(21) Appl. No.: 12/544,286

(22) Filed: Aug. 20, 2009

(65) Prior Publication Data
US 2011/0043499 A1 Feb. 24, 2011

(51) Int. Cl.
G09G 5/00 (2006.01)
(52) U.S. Cl. .................................................. 345/205
(58) Field of Classification Search .................. None
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,369,357 A | 11/1994 | Erhardt | |
| 5,850,205 A * | 12/1998 | Blouin | 345/102 |
| 6,028,441 A | 2/2000 | Alvord | |
| 6,384,529 B2 | 5/2002 | Tang | |
| 6,690,351 B1 * | 2/2004 | Wong | 345/156 |
| 6,919,681 B2 | 7/2005 | Cok et al. | |
| 6,987,355 B2 | 1/2006 | Cok et al. | |
| 6,995,519 B2 | 2/2006 | Arnold | |
| 7,129,923 B2 * | 10/2006 | Lu | 345/92 |
| 7,230,594 B2 | 6/2007 | Miller et al. | |
| 7,301,523 B2 * | 11/2007 | Kamei | 345/102 |
| 7,417,215 B2 * | 8/2008 | Choi | 250/208.2 |
| 7,518,307 B2 * | 4/2009 | Kim | 313/505 |
| 7,825,361 B2 * | 11/2010 | Pak et al. | 250/205 |
| 2002/0190972 A1 * | 12/2002 | Ven de Van | 345/204 |
| 2003/0153105 A1 | 8/2003 | Burch | 438/14 |
| 2004/0032637 A1 | 2/2004 | Imamura | 359/245 |
| 2004/0263460 A1 * | 12/2004 | Lu | 345/98 |
| 2006/0055864 A1 | 3/2006 | Matsumura et al. | 349/187 |
| 2006/0061524 A1 * | 3/2006 | Suh et al. | 345/76 |
| 2006/0087247 A1 * | 4/2006 | Malmberg | 315/169.2 |
| 2007/0046581 A1 * | 3/2007 | Kwak et al. | 345/68 |
| 2007/0075936 A1 * | 4/2007 | Kim | 345/76 |
| 2007/0139312 A1 * | 6/2007 | Kwak | 345/76 |

(Continued)

FOREIGN PATENT DOCUMENTS
WO WO 00/49658 8/2000

*Primary Examiner* — Peter Vincent Agustin
(74) *Attorney, Agent, or Firm* — Morgan, Lewis & Bockius LLP

(57) ABSTRACT

A method of making a display includes providing a display substrate having a plurality of control electrodes in a display area; locating a plurality of chiplets responsive to a controller to provide current to the control electrodes, each chiplet having a separate substrate, at least one pixel connection pad electrically connected to a control electrode, and one or more test light emitters formed in the chiplet responsive to the current provided on the control electrodes to emit light; controlling the chiplets to pass current through one or more of the test light emitters formed in the chiplet to emit light; detecting the light emitted by the test light emitters to determine faulty chiplets or chiplet interconnections; replacing or repairing the faulty chiplets or chiplet interconnections; and forming an organic light emitting diode over the substrate in the display area connected to the control electrodes.

11 Claims, 9 Drawing Sheets

U.S. PATENT DOCUMENTS

| | | | |
|---|---|---|---|
| 2008/0142805 A1 | 6/2008 | Koyama | 257/59 |
| 2009/0027316 A1* | 1/2009 | Kim | 345/80 |
| 2009/0262048 A1* | 10/2009 | Park et al. | 345/76 |
| 2010/0097297 A1* | 4/2010 | Jiang et al. | 345/55 |
| 2011/0043499 A1* | 2/2011 | Cok et al. | 345/205 |

* cited by examiner

OPTICALLY TESTING CHIPLETS IN DISPLAY DEVICE

CROSS REFERENCE TO RELATED APPLICATION

Reference is made to commonly-assigned U.S. patent application Ser. No. 12/191,478 filed Aug. 14, 2008, entitled "OLED Device With Embedded Chip Driving" by Dustin L. Winters et al, the disclosure of which is incorporated herein.

FIELD OF THE INVENTION

The present invention relates to display devices having a substrate with distributed, independent chiplet control elements and optically testing such chiplets.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. Pixels and sub-pixels are not distinguished herein; all light-emitting elements are called pixels. A variety of flat-panel display technologies are known, for example plasma displays, liquid crystal displays, and light-emitting diode displays. Active-matrix elements are not necessarily limited to displays and can be distributed over a substrate and employed in other applications requiring spatially distributed control.

Light-emitting diodes (LEDs) incorporating thin films of light-emitting materials forming light-emitting elements have many advantages in a flat-panel display device and are useful in optical systems. U.S. Pat. No. 6,384,529 to Tang et al. shows an organic LED color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 by Cok. It is also known to employ a white sub-pixel that does not include a color filter, for example, as taught in U.S. Pat. No. 6,919,681 by Cok et al. A design employing an unpatterned white emitter has been proposed together with a four-color pixel including red, green, and blue color filters and sub-pixels and an unfiltered white sub-pixel to improve the efficiency of the device (see, e.g. U.S. Pat. No. 7,230,594 to Miller, et al).

Two different methods for controlling the pixels in a flat-panel display device are generally known: active-matrix control and passive-matrix control. In an active-matrix device, control elements are distributed over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the brightness of the sub-pixel. Each light-emitting element typically employs an independent control electrode and a common electrode.

Prior-art active-matrix control elements typically include thin-film semiconductor materials, such as silicon, formed into transistors and capacitors through photolithographic processes. The thin-film silicon can be either amorphous or polycrystalline. Thin-film transistors made from amorphous or polycrystalline silicon are relatively larger and have lower performance than conventional transistors made from crystalline silicon wafers. Moreover, such thin-film devices typically exhibit local or large-area non-uniformity that results in perceptible non-uniformity in a display employing such materials. While improvements in manufacturing and materials processes are made, the manufacturing processes are expensive and thin-film device performance continues to be lower than the performance of crystalline silicon devices.

Matsumura et al discuss crystalline silicon substrates used with LCD displays in U.S. Patent Application Publication No. 2006/0055864. Matsumura describes a method for selectively transferring and affixing pixel-control devices made from first semiconductor substrates onto a second planar display substrate. Wiring interconnections within the pixel-control device and connections from busses and control electrodes to the pixel-control device are shown. However, there is no teaching of improving the aperture ratio of a display, reducing the cost of such pixel-control devices in cooperation with a display device, or testing the pixel-control devices.

Electronic device testing is well known in the prior art. For example, U.S. Pat. No. 6,028,441 describes self-testing routines in an LED display device by monitoring current use by the LEDs. U.S. Pat. No. 5,369,357 describes an optically operated test structure for a CCD imager for testing the modulation transfer function for the CCD. Electrical testing methods for OLED devices are described in U.S. Patent Application Publication 2007/0046581 and in U.S. Pat. No. 6,995,519.

Yields are important in manufacturing low-cost flat-panel displays. It is important, therefore, that any flaws in the manufacturing process be detected as early as possible so as to repair the flaws or discard the flawed devices without incurring any further manufacturing expense. In the prior art, flat-panel displays are tested after manufacture and repaired, if necessary. By testing displays during the manufacturing process, the cost of repair is reduced and the manufacturing yields improved. It is also important to test devices in an efficient way. In particular, displays with many pixels (e.g. high-definition televisions) can take a long time to sequentially test each pixel. Therefore, test methods that can be implemented quickly are useful in the manufacturing process.

There is a need, therefore, for improving the performance of active-matrix light-emissive displays and testing such displays in an efficient and effective manner, in a short period of time, during or after manufacture, in order to improve the manufacturing yield of the active-matrix light-emissive displays.

SUMMARY OF THE INVENTION

The present invention includes a method of making a display, comprising:

(a) providing a display substrate having a display area and a plurality of control electrodes in the display area;

(b) locating a plurality of chiplets responsive to a controller to provide current to the control electrodes, each chiplet having a chiplet substrate separate from the display substrate, at least one pixel connection pad electrically connected to a control electrode, and one or more test light emitters formed in the chiplet responsive to the current provided on the control electrodes to emit light;

(c) controlling the chiplets to pass current through one or more of the test light emitters formed in the chiplet to emit light from the chiplet;

(d) detecting the light emitted by the test light emitters to determine faulty chiplets or chiplet interconnections;

(e) replacing or repairing the faulty chiplets or chiplet interconnections; and (f) forming an organic light emitting diode over the substrate in the display area connected to the control electrodes.

Another aspect of the invention is a display, comprising:

(a) a display substrate having a display area, and a plurality of chiplets having a substrate independent of the display substrate located over the display substrate in the display area, each chiplet having at least one connection pad, at least one pixel control circuit, and at least one pixel test circuit;

(b) a plurality of pixels located in the display area, each pixel including a control electrode, a second electrode, and at least one layer of light-emitting material located between the control electrode and second electrode, wherein the pixel control circuit is connected to the control electrode for driving the control electrode causing the light-emitting material to emit light;

(c) a controller connected to one or more chiplets for providing external control signals to the chiplet; and (d) wherein the pixel test circuit includes one or more test light emitters responsive to the external control signals, the test light emitters emitting light independently of the layer of light-emitting material.

The present invention has the advantage that it improves the performance of control elements in a flat-panel substrate and provides an efficient way to test chiplets and electrical connections. The invention is particularly useful during fabrication of OLED devices including chiplets to ensure that the chiplets are operating properly prior to the fabrication of the OLED layers in the device.

DETAILED DESCRIPTION OF THE INVENTION

Figure 1:
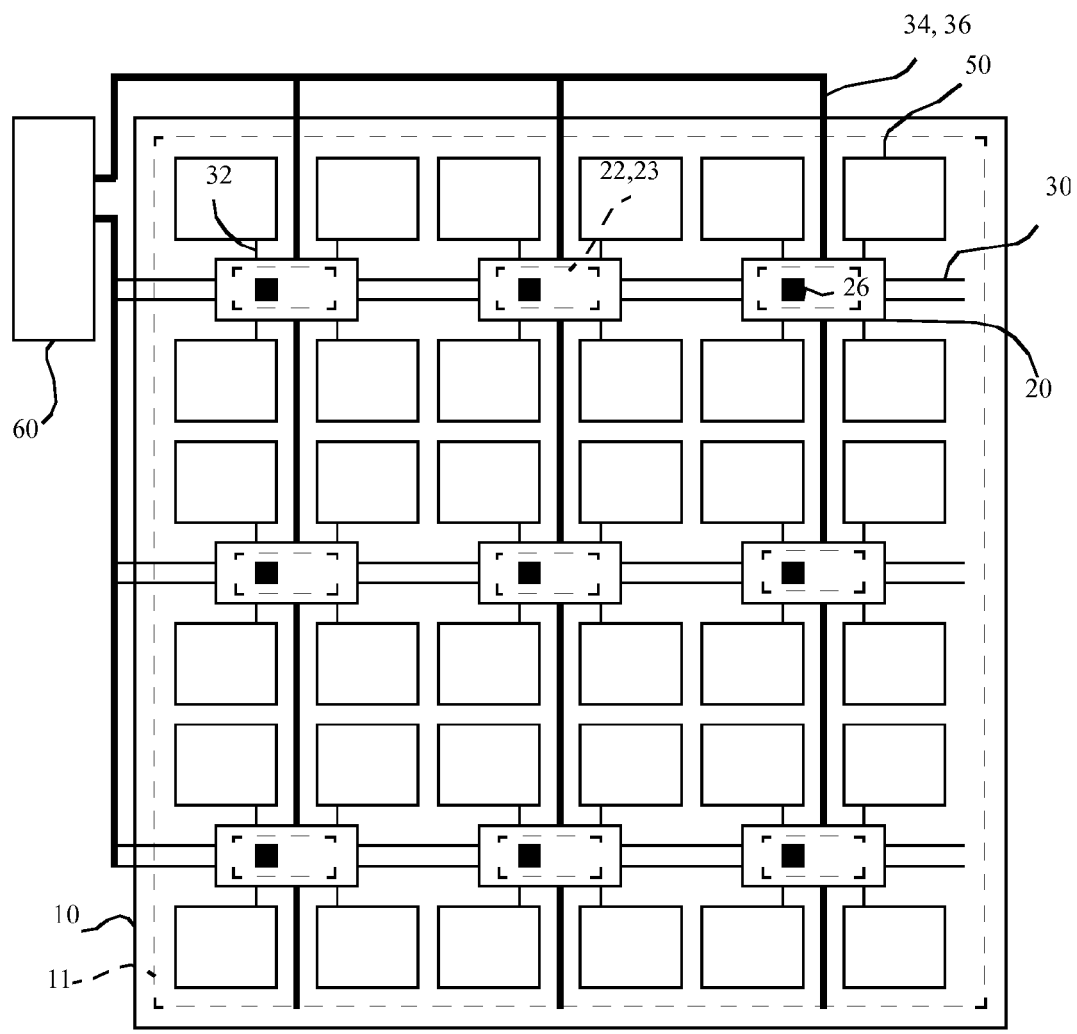
FIG. 1 is a display schematic according to an embodiment of the present invention.
Figure 8:
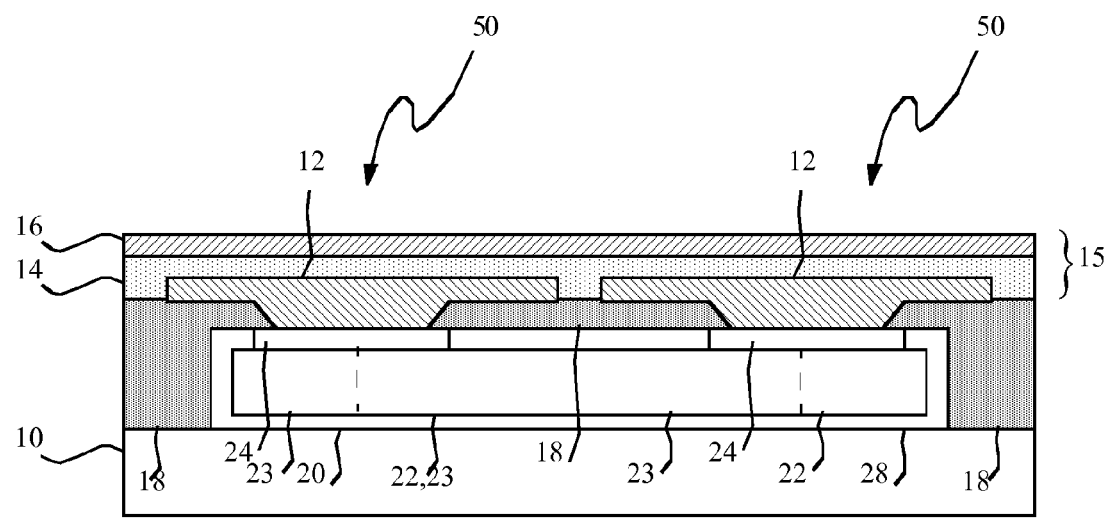
FIG. 8 is a partial cross section of a display and chiplet according to an embodiment of the present invention.

Referring to schematic FIG. 1 and cross-section FIG. 8, a display, according to one embodiment of the present invention, includes a display substrate 10 having a display area 11. A plurality of pixels 50 are located in the display area 11, each pixel 50 including a control electrode 12, a second electrode 16, and at least one layer of light-emitting material 14 located between the control electrode 12 and second electrode 16 that emits light in response to a current provided by the control electrode 12 and the second electrode 16. A plurality of chiplets 20 having a chiplet substrate 28 independent of the display substrate 10 are located over the display substrate 10 in the display area 11, each chiplet 20 having at least one connection pad 24, at least one pixel control circuit 22, and at least one pixel test circuit 23. The pixel control circuit 22 is connected to the control electrode 12 through an electrical connection 32 for driving the control electrode 12 and the layer of light-emitting material 14 to emit light. The pixel control circuit 22 is responsive to external control signals 30, 34, 36 from a controller 60 connected to one or more chiplets 20 that provides external control signals to the chiplet 20. The pixel test circuit 23 includes one or more test light emitters 26 responsive to the external control signals 34, 36, the test light emitters 26 emit light independently of the layer of light-emitting material 14 and second electrode 16.

As used herein, the light-emitting pixels are area emitters, employing layers of material coated over a substrate and driven by electrodes coated over and under the layers of material. The light-emitting material layers are not crystalline or formed in silicon. In contrast, the test light emitters can be conventional inorganic diodes formed in a crystalline material, such as silicon, that emit light from a small, point source.

Figure 2:
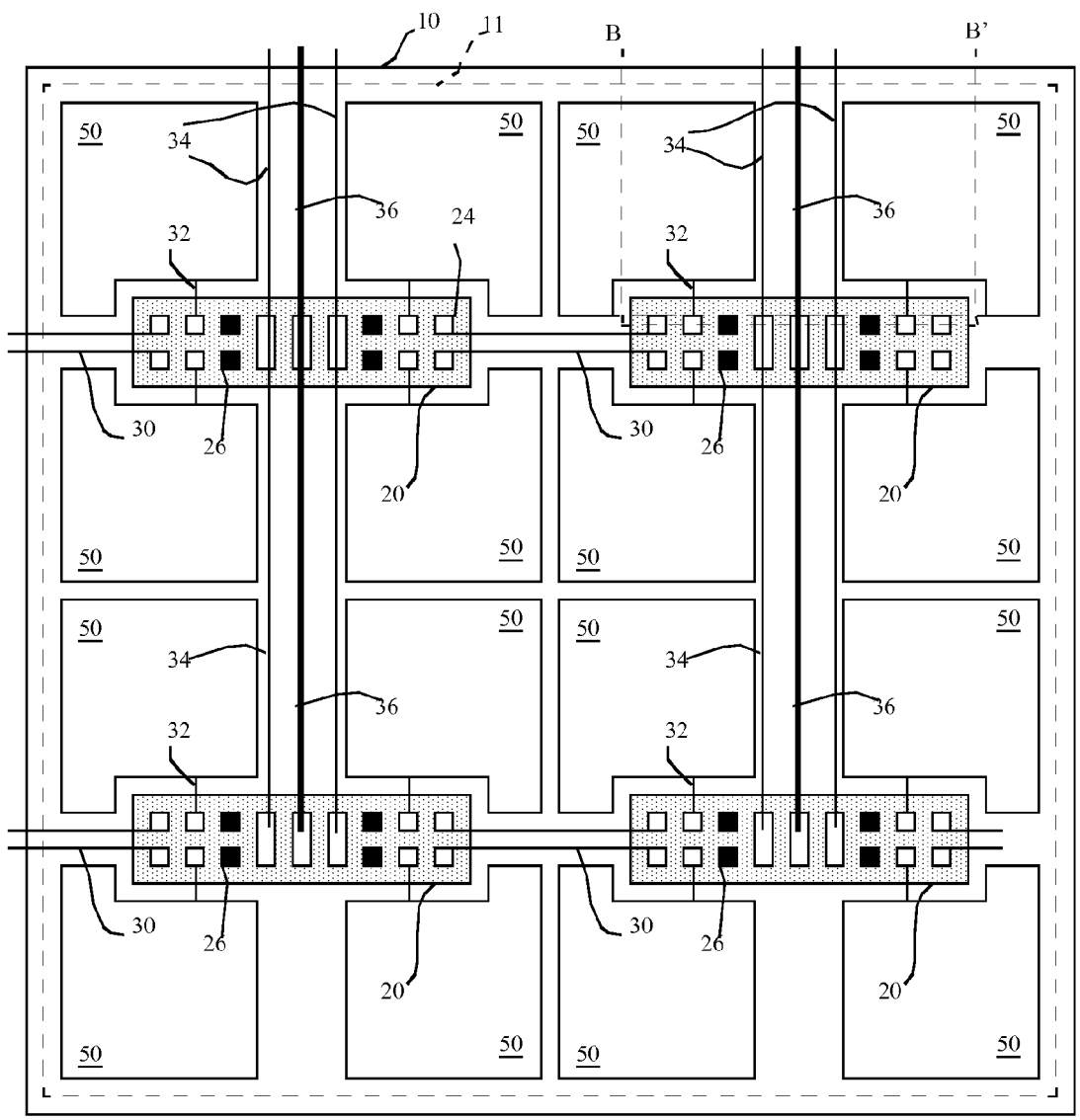
FIG. 2 is a schematic of a portion of a display according to an embodiment of the present invention.

FIG. 2 illustrates a more detailed portion of an embodiment of the present invention. Referring to FIG. 2, the test light emitter 26 is provided for each pixel 50 on the substrate 10 in the display area 11. Pixel test circuits 23 in each chiplet 20 drives the test light emitters 26 to emit light in response to external control signals such as, for example, control signals 36, data signals 34, or select signals 30. Each pixel 50 can be driven by pixel control circuit 22 with electrical connections 32 connecting the pixel 50 to the chiplet 20 through connection pads 24. The test light emitters 26 can be responsive to current provided to its associated pixel 50.

Figure 9:
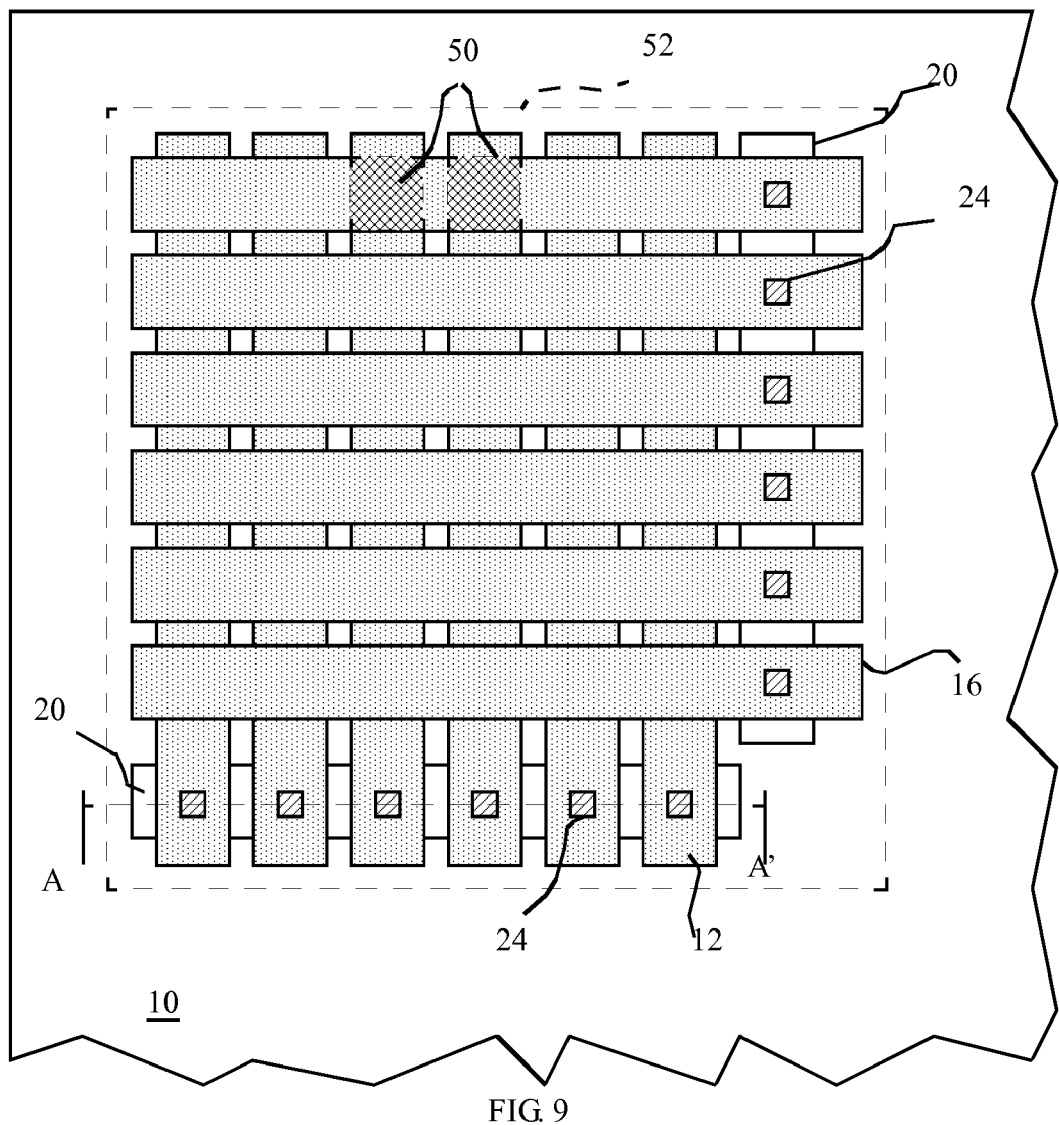
FIG. 9 is a schematic of a pixel group according to an embodiment of the present invention.

As shown in FIG. 8, according to one active-matrix embodiment of the present invention having the chiplet 20 control device, each pixel 50 can have an independently controlled control electrode 12, the second electrode 16 can be common to multiple pixels 50, and the pixel control circuit 22 provides active-matrix control to the pixels 50. As is also shown in FIG. 8, the pixel control circuit 22 can drive more than one pixel 50. The connection pad 24 on the chiplet 20 can connect directly to a control electrode 12 (as shown) or through an electrical connection 32. In an alternative embodiment of the present invention illustrated in FIG. 9, one or more pixel control circuits 22 can provide passive-matrix control to a plurality of groups 52 of pixels 50. Such passive-matrix-controlled pixel groups 52 can be formed by the overlap of independent orthogonal column and row electrodes oriented in different directions that can correspond to electrodes 12 and 16. Pixel control circuits 22, for example in chiplets 20, can provide drive currents to activate the column and row electrodes 12, 16 to drive current through the pixels 50. Connection pads 24 can connect the chiplets 20 to the electrodes 12, 16. FIG. 8 is a cross section taken along line A, A' of FIG. 9.

The pixel control circuit 22 of various embodiments can be implemented in thin-film circuits on a substrate. However, such circuits are large and have relatively lower performance than circuits formed in crystalline silicon. Therefore, in an embodiment of the present invention, the pixel control circuits 22 are formed in chiplets 20 having separate substrates 28 that are adhered to the display substrate 10. Referring to FIG. 8 in more detail, the chiplet 20 having a separate chiplet substrate 28 is adhered to the substrate 10 and buried with an adhesion planarization layer 18. The chiplet 20 includes pixel control circuit 22. First electrodes 12 are electrically connected to connection pads 24 formed on the chiplet 20. Light-emitting material layer 14 is located over the first electrodes 12 and second electrodes 16 formed over the light-emitting material layer 14. The light-emitting material layer 14 can include multiple layers of light-emitting material as well as various charge-control layers as are known in the organic and inorganic light-emitting diode art. The electrodes 12, 16 and layer(s) of light-emitting material 14 form a light-emitting diode 15.

Figure 3:
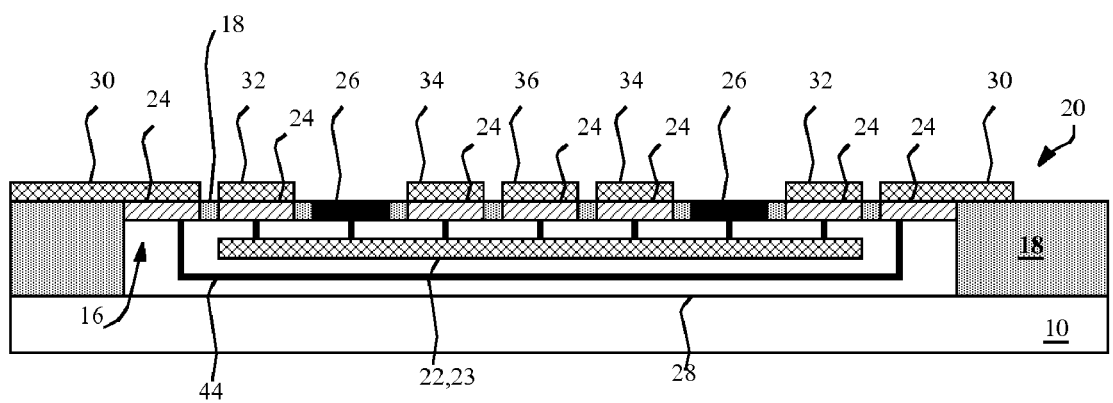
FIG. 3 is a cross section of a chiplet according to an embodiment of the present invention.

FIG. 3 shows a cross section of the chiplet 20 taken from lines B, B' in FIG. 2, according to an embodiment of the present invention. The chiplet 20 is adhered to the substrate 10 with an adhesive and planarizing layer 18, for example including resin. Internal electrical connections 44 such as wires can connect the connection pads 24 within the chiplet 20 and pixel control circuit 22 can be used to respond to external signals 30, 34, and 36 to drive electrical connections 32 connected to pixels 50 and to drive the test light emitters 26 formed in the chiplet 20. Signals 30, 34, 36 can be connected over the top of a chiplet 20 or electrically connected through the chiplet 20 (as shown for select signal 30).

As shown in FIG. 1, the test light emitter 26 is formed in each chiplet 20 and is associated with each pixel test circuit 23. In this configuration, the test light emitter 26 can be responsive to current provided to more than one pixel 50, for example the pixels 50 connected to the same chiplet 20, controlled through the pixel control circuit 22. In one embodiment of the present invention, the test light emitter 26 sequentially responds to current provided to each of the pixels 50 driven by the pixel control circuit 22 in one chiplet 20.

Figure 4A:
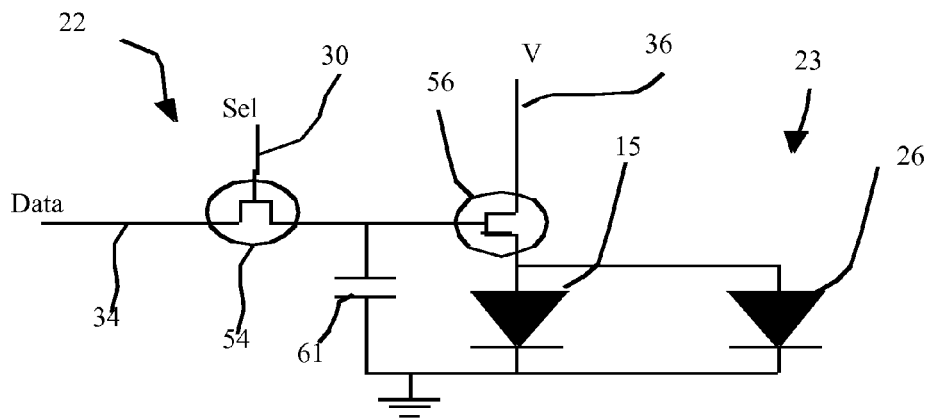
FIGS. 4A-4C are schematics of various pixel and test light emitter driving circuits according to alternative embodiments of the present invention.

The pixel test circuitry 23 can drive the test light emitters 26 in a variety of ways according to a variety of embodiments of the present invention. For example, as shown in FIG. 4A, the test light emitter 26 can be connected in parallel with the light emitting diode 15 so that whenever the light emitting diode 15 is driven by driving transistor 56, both the light emitting diode 15 and the test light emitter 26 will emit light. A display driving transistor 56 is responsive to a charge stored in a storage capacitor 61 that is deposited by external select signal 30 and data signal 34 through a control transistor 54.

Figure 4B:
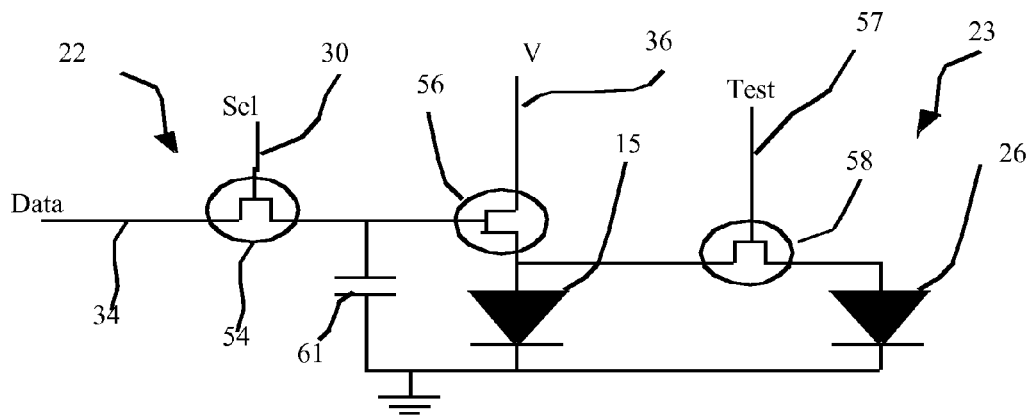

Alternatively, as shown in FIG. 4B, the test light emitter 26 can be driven by the test control transistor 58 responsive to current provided to at least one pixel. The test control transistor 58 can be connected to the output of the driving transistor 56 and controlled by a test signal 57 so that, with the provision of the test signal 57, current can flow from the driving transistor 56 through the test light emitter 26. The driving transistor 56 is responsive to a charge stored in storage capacitor 61 that is deposited by external select signal 30 and data signal 34 through control transistor 54.

Figure 4C:
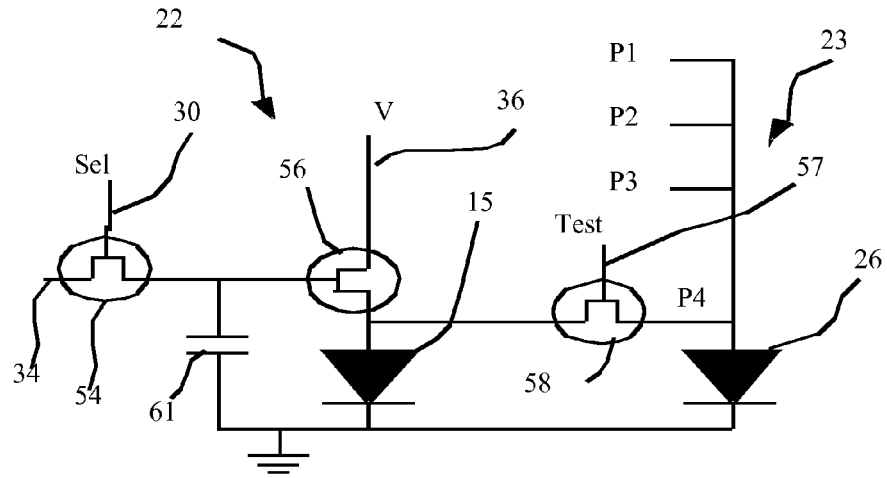

Referring to FIG. 4C, a plurality of test signals can control a corresponding plurality of test control transistors 58 whose output is connected in a wired OR configuration. If any of the test control transistors 58 is turned on by test signal 57, test light emitter signal P4 conducts current through test light emitter 26. Similar circuits, each having a separate test signal 57 and test control transistor 58, are connected to test light emitter signals P1, P2, and P3 so that upon the application of the test signal 57, the corresponding test control transistor 58 is activated, and the corresponding test light emitter signal conducts current through the test light emitter 26. Thus, a single test light emitter 26 can be responsive to a plurality of pixel control circuits 22, either together or independently, depending on the test signals 57. The driving transistor 56 is responsive to a charge stored in storage capacitor 61 that is deposited by external select signal 30 and data signal 34 through transistor 54.

Figure 5:
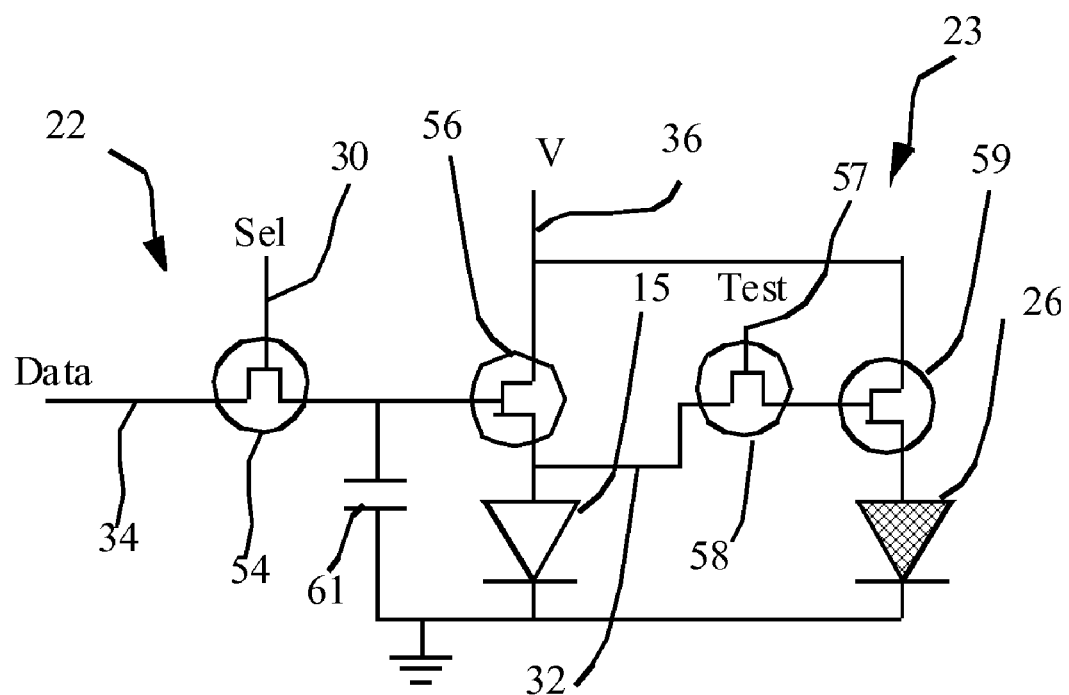
FIG. 5 is a schematic of a pixel and test light emitter driving circuit according to another embodiment of the present invention.

Referring to FIG. 5, a test light driving transistor 59 can drive the test light emitter 26 with an independently controlled current by connecting the output of the test control transistor 58 to the gate of the test light driving transistor 59. This prevents current intended for the light-emitting diode 15 from being used to drive the test light emitter 26. Note that the amount of current driven through the test light emitter 26 can be controlled and correspond to the current driven through the light-emitting diode 15, so that the test light emitter 26 can provide a range of light emission corresponding to the range of light emission of the light-emitting diode 15, enabling a wider variety of test capabilities. The driving transistor 56 is responsive to a charge stored in storage capacitor 61 that is deposited by external select signal 30 and data signal 34 through transistor 54.

Figure 7:
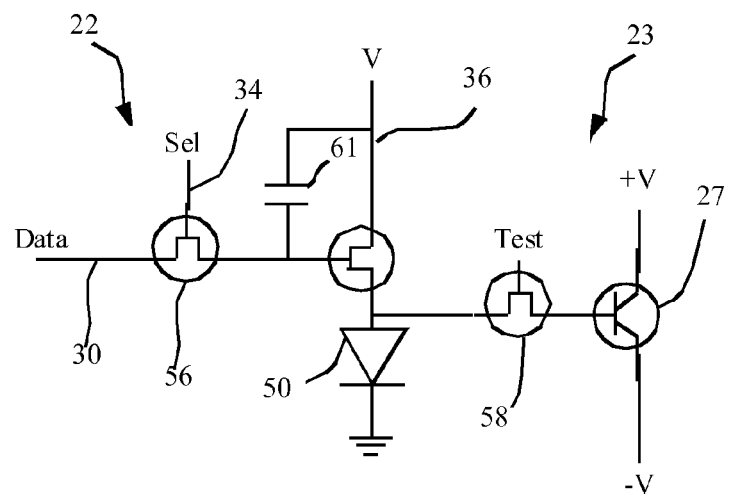
FIG. 7 is a schematic of a pixel and test light emitter driving circuits according to another embodiment of the present invention.

In one embodiment of the present invention, the test light emitter 26 can be formed in a chiplet having a silicon substrate with doped or undoped areas. Therefore, the test light emitter 26 can be constructed as an inorganic light emitting diode that provides an inorganic point-source light emitter, for example a conventional light-emitting diode formed in crystalline semiconductor material, such as silicon. As shown in FIG. 7, the test light emitter 26 can be a light-emitting NPN bipolar transistor 27. The NPN bipolar transistor 27 can include an emitter-base junction and the circuit can include a structure that provides a non-destructive reverse breakdown voltage across the emitter-base junction to cause the transistor to emit light. Because the transistor is formed on and in the surface of the chiplet, light emitted by the transistor can visibly escape from the chiplet.

Figures 6, 10:
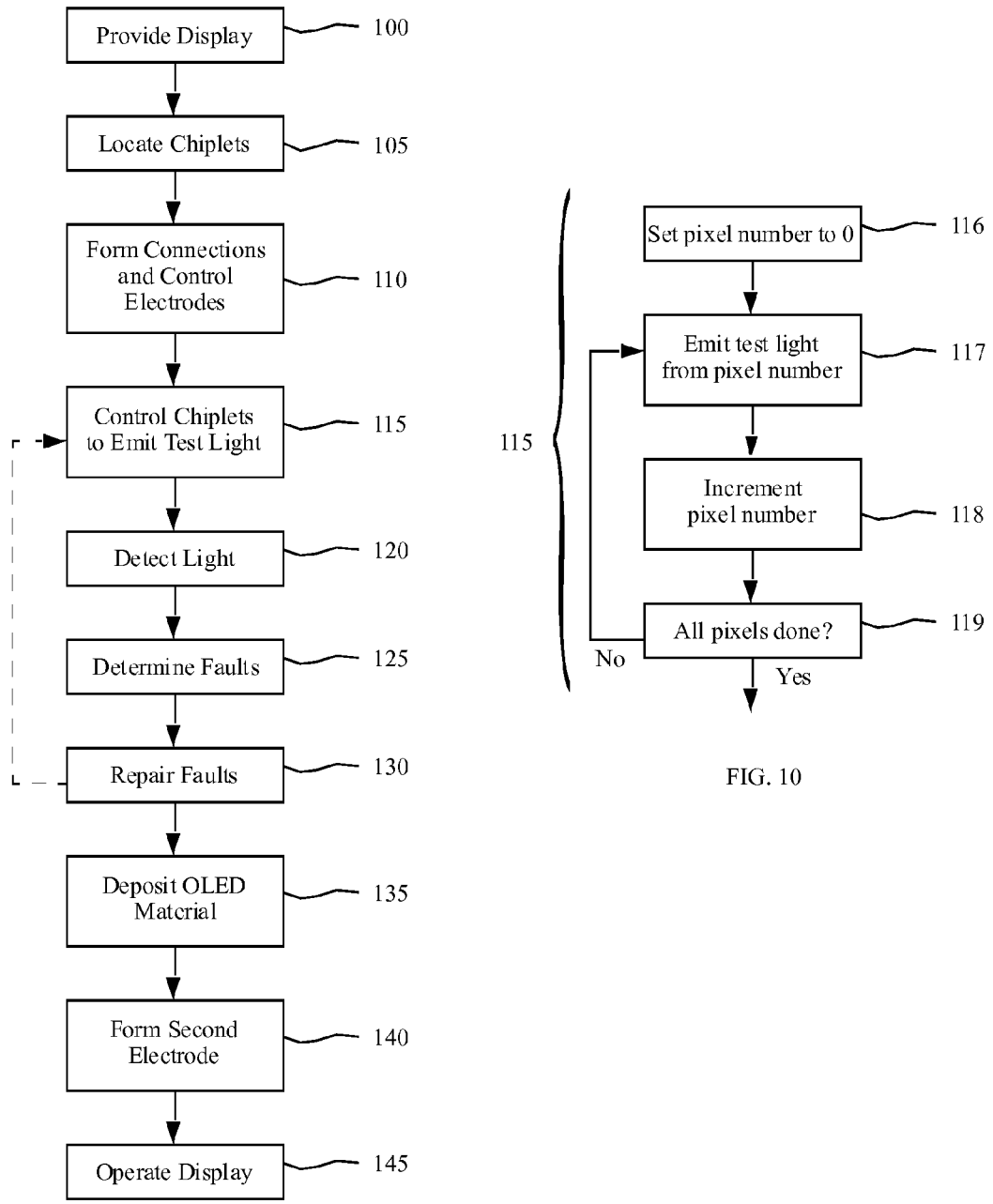
FIG. 6 is a flow diagram of a method of the present invention.
FIG. 10 is a flow diagram of a method of the present invention.

Referring to FIG. 6 the test light emitters 26 can be employed, according to an embodiment of the present invention, in a method of making a display. A display substrate is provided (Step 100), and a plurality of chiplets responsive to a controller to provide current to a plurality of control electrodes located (Step 105) over the substrate in the display area. Each chiplet can have a chiplet substrate separate from the display substrate and at least one pixel connection pad can be electrically connected (Step 110) to a control electrode and one or more test light emitters formed in the chiplet that is responsive to the current provided on the control electrodes to emit light. The chiplets are controlled (Step 115) to pass current through one or more of the test light emitters formed in the chiplet to emit light from the chiplet. According to one embodiment of the present invention and as shown in FIG. 6, the chiplets can be controlled to emit light simultaneously from all of the test light emitters. Alternatively, the test light emitters can be controlled individually in sequence, for example as shown in FIG. 10. Referring to FIG. 10, the Step 115 of controlling the test light emitters can be performed in a series of steps in which a pixel counter number is first set (Step 116) to zero, the pixel corresponding to the pixel counter controlled to emit 117 light, the pixel number is incremented (Step 118) and tested (Step 119). If all of the pixels are tested, the process of FIG. 10 completes; if not, the next pixel is tested.

Figure 11:
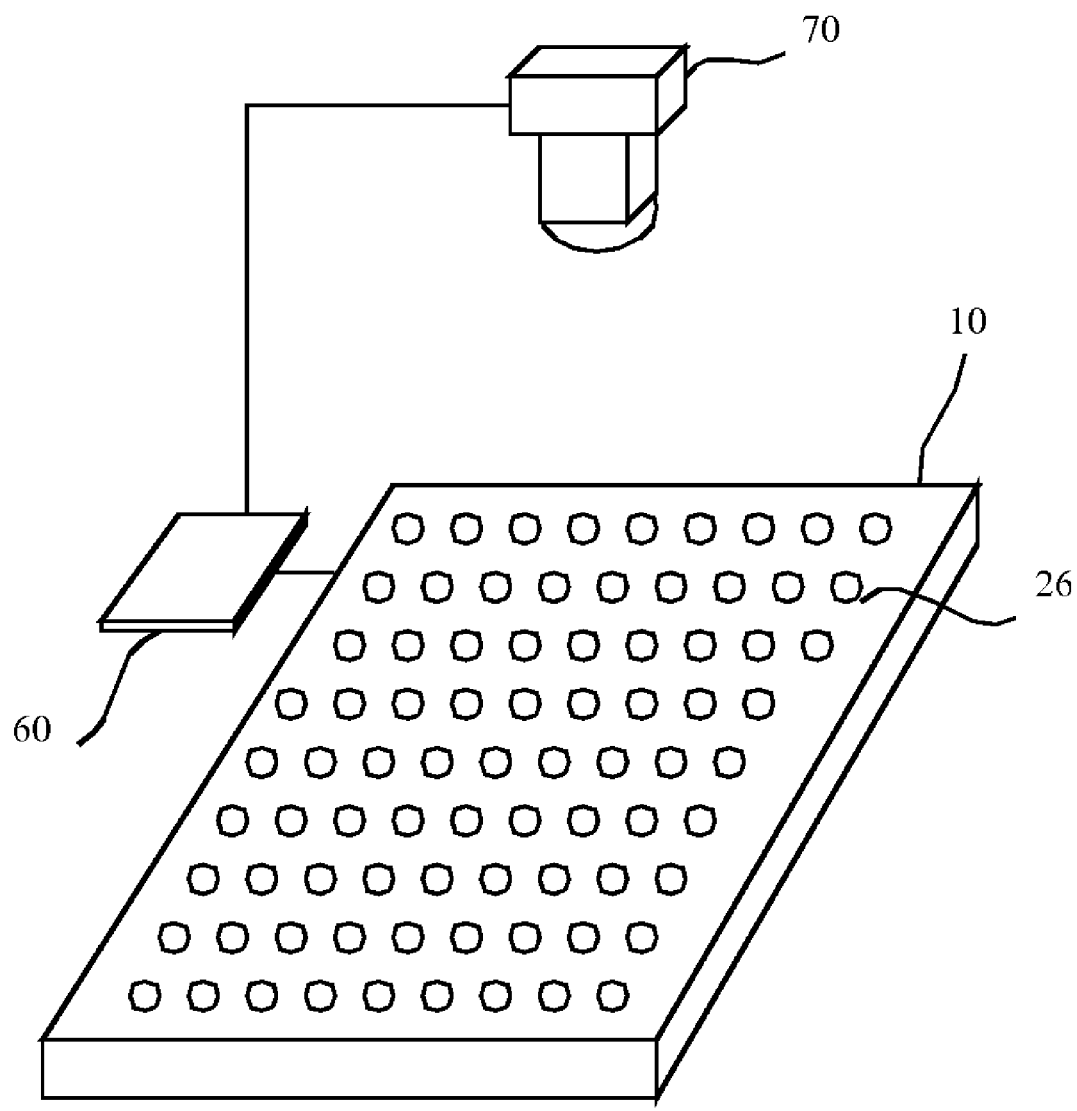
FIG. 11 is a system diagram of display with test light emitters and an electronic camera according to a method of the present invention.

The light emitted by the test light emitters can be detected (Step 120) to determine (Step 125) faulty chiplets or faulty chiplet interconnections. For example, as shown in FIG. 11, the substrate 10 with test light emitters 26 distributed thereon can be imaged by an electronic camera 70 (Step 120 of FIG. 6). The image can then be analyzed (Step 125 of FIG. 6) to determine any faults in the test light emitters, chiplets, or chiplet interconnections, for example by the controller 60 or a separate computer system (not shown). Returning to FIG. 6, the faulty chiplets or faulty chiplet interconnections are replaced or repaired (Step 130). The process can return to Step 115 to confirm that the repairs are correct and complete. At this point in the process, a functioning backplane is constructed.

At least one layer of light-emitting material is deposited (Step 135) over the control electrodes and a second electrode formed (Step 140) over the one or more layers of light-emitting material. The control electrode, at least one layer of light-emitting material, and the second electrode form a light-emitting pixel responsive to current provided by the control electrode and the second electrode. The display is then operated (Step 145) by controlling the chiplets with the controller to drive the control electrodes to provide current through the light-emitting layer so that the pixels emit light.

In one embodiment of the present invention, the light from the test light emitter is detected by employing an image sensor to form an image of the display area while the test light emitters are controlled to emit light (FIG. 11). The test light emitters can be controlled to emit light simultaneously or, alternatively, the test light emitters can be controlled to emit light sequentially (FIG. 10). In yet another embodiment of the present invention, the test light emitters can be controlled to emit light at a luminance corresponding to the luminance desired for the pixels. The image or images formed of the test light emitters can be analyzed to determine faults using mathematical and image analysis software.

Chiplets can have a single row or multiple rows of connection pads along a relatively long side of the chiplet longer than a relatively shorter neighboring side. Chiplets can be connected to an external controller through a buss or through multiple busses. The busses can be serial, parallel, or point-to-point busses and can be digital or analog. A buss is connected to the chiplets to provide signals, such as power, ground, clock, data, or select signals. More than one buss separately connected to one or more controllers or chiplets can be employed.

In operation, a controller receives and processes an information signal according to the needs of the display device and transmits the processed signal and control information to each chiplet in the device. The processed signal includes luminance information for each light-emitting pixel element. The luminance information can be stored in an analog or digital storage element corresponding to each light-emitting pixel element. The chiplets then activate the pixel electrodes to which they are connected. At the same time, or in response to a test signal, the test light emitters are illuminated through the circuitry and an image of the light-emission from the test light emitters is formed. The image is analyzed to determine faults in the display device. Repairs can be made to correct the faults. If the light emitting diode is not yet constructed, it can then be constructed and the display device completed and put into operation.

Additional busses can supply a variety of signals, including timing (e.g. clock) signals, data signals, select signals, power connections, or ground connections. The signals can be analog or digital, for example digital addresses or data values. Analog data values can be supplied as charge or voltage. The storage registers can be digital (for example including flip-flops) or analog (for example including capacitors for storing charge).

In one embodiment of the present invention, the display device is an OLED display. The controller can be implemented as a chiplet and affixed to the substrate. The controller can be located on the periphery of the substrate, or can be external to the substrate and include a conventional integrated circuit.

According to various embodiments of the present invention, the chiplets can be constructed in a variety of ways, for example with one or two rows of connection pads along a long dimension of a chiplet. Interconnection busses and wires can be formed from various materials and use various methods for deposition on the device substrate. For example, interconnection busses and wires can be metal, either evaporated or sputtered, for example aluminum or aluminum alloys, magnesium, or silver. Alternatively, the interconnection busses and wires can be made of cured conductive inks or metal oxides. In one cost-advantaged embodiment, the interconnection busses and wires are formed in a single layer.

The present invention is particularly useful for multi-pixel device embodiments employing a large device substrate, e.g. glass, plastic, or foil, with a plurality of chiplets arranged in a regular arrangement over the device substrate. Each chiplet can control a plurality of pixels formed over the device substrate according to the circuitry in the chiplet and in response to control signals. Individual pixel groups or multiple pixel groups can be located on tiled elements, which can be assembled to form the entire display.

According to the present invention, chiplets provide distributed pixel control elements over a substrate. A chiplet is a relatively small integrated circuit compared to the device substrate and includes a circuit including wires, connection pads, passive components such as resistors or capacitors, or active components such as transistors or diodes, formed on an independent substrate. Chiplets are manufactured separately from the display substrate and then applied to the display substrate. The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet circuitry is disposed. A plurality of chiplets therefore has a corresponding plurality of substrates separate from the device substrate and each other. In particular, the independent substrates are separate from the substrate on which the pixels are formed and the areas of the independent, chiplet substrates, taken together, are smaller than the device substrate.

Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material over the chiplet that can then be applied using conventional spin- or curtain-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses and electrodes to drive pixels. Chiplets can control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connections to the wiring layer provided over the chiplets once assembled onto the display substrate. The connection pads must be sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. This shows that the pads will generally be significantly larger than the transistor circuitry formed in the chiplet.

The pads can generally be formed in a metallization layer on the chiplet over the transistors. It is desirable to make the chiplet with as small a surface area as possible to enable a low manufacturing cost.

By employing chiplets with independent substrates (e.g. including crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced. A useful chiplet can also be formed using micro-electro-mechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

The device substrate can include glass and the wiring layers made of evaporated or sputtered metal or metal alloys, e.g. aluminum or silver, formed over a planarization layer (e.g. resin) patterned with photolithographic techniques known in the art. The chiplets can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, to Tang et al., and U.S. Pat. No. 5,061,569 to VanSlyke et al. Inorganic devices, for example, employing quantum dots formed in a polycrystalline semiconductor matrix (for example, as taught in U.S. Patent Application Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having a top-emitter architecture or having a bottom-emitter architecture.

The invention has been described in detail with particular reference to certain preferred embodiments thereof, but it should be understood that variations and modifications can be effected within the spirit and scope of the invention.

PARTS LIST

A, A' cross section line
B, B' cross section line
P1, P2, P3, P4 test light emitter signal
10 substrate
11 display area
12 electrode
14 light-emitting material layer
15 light emitting diode
16 electrode
18 adhesive and planarization layer
20 chiplet
22 pixel control circuit
23 pixel test circuit
24 connection pad
26 test light emitter
27 light-emitting transistor
28 chiplet substrate
30 select signal
32 electrical connection
34 data signal
36 control signal
44 chiplet internal electrical connection
50 pixel
52 pixel group
54 control transistor
56 display driving transistor
57 test signal
58 test control transistor
59 test light driving transistor
60 controller
61 storage capacitor
70 electronic camera
100 provide display step
105 locate chiplets step
110 form connections step
115 control chiplets step
116 set pixel number step
117 emit test light step
118 increment pixel number step
119 pixel count test step
120 detect light step
125 determine faults step
130 repair faults step
135 deposit OLED material step
140 form second electrode step
145 operate display step

The invention claimed is:

1. A display, comprising:
(a) a display substrate having a display area, and a plurality of chiplets having a substrate independent of the display substrate located over the display substrate in the display area, each chiplet having at least one connection pad, at least one pixel control circuit, and at least one pixel test circuit;
(b) a plurality of pixels located in the display area, each pixel including a control electrode, a second electrode, and at least one layer of light-emitting material located between the control electrode and second electrode, wherein the pixel control circuit is connected to the control electrode for driving the control electrode causing the light-emitting material to emit light;

(c) a controller connected to one or more chiplets for providing external control signals to the chiplet; and (d) wherein the pixel test circuit includes one or more test light emitters responsive to the external control signals, the test light emitters emitting light independently of the layer of light-emitting material.

2. The display of claim 1, wherein each pixel has an independently controlled control electrode, the second electrode is common, and the pixel control circuit provides active-matrix control to the pixel.

3. The display of claim 1, wherein the pixel control circuit drives more than one pixel.

4. The display of claim 1, wherein the control electrodes and the second electrodes of a group of pixels form an array of row and column electrodes, each row and column electrode oriented in a different direction, the pixels defined by the overlapping of the control and second electrodes, and one or more of the pixel control circuits provide a passive-matrix control to the group of pixels.

5. The display of claim 1, including means for driving a test light emitter from each pixel responsive to current provided to that pixel.

6. The display of claim 1, including means for driving a test light emitter from each pixel control circuit.

7. The display of claim 1, including means for driving one test light emitter responsive to current provided to more than one pixel.

8. The display of claim 1, wherein each pixel test circuit includes a transistor for driving the test light emitter in response to current provided to at least one pixel.

9. The display of claim 1, wherein the test control circuit further includes a test signal that controls the test light emitter.

10. The display of claim 1, wherein the chiplet substrate is silicon.

11. The display of claim 1, wherein the test light-emitter is an inorganic point-source emitter.

* * * * *